(12) United States Patent
Sastry et al.

(10) Patent No.: US 10,777,804 B2
(45) Date of Patent: Sep. 15, 2020

(54) ELECTROCHEMICAL CELL INCLUDING FUNCTIONALLY GRADED AND ARCHITECTURED COMPONENTS AND METHODS

(71) Applicant: Sakti3, Inc., Ann Arbor, MI (US)

(72) Inventors: Ann Marie Sastry, Ann Arbor, MI (US); Fabio Albano, Canton, MI (US); Chia-Wei Wang, Ann Arbor, MI (US)

(73) Assignee: Sakti3, Inc., Ann Arbor, MI (US)

( * ) Notice: Subject to any disclaimer, the term of this patent is extended or adjusted under 35 U.S.C. 154(b) by 584 days.

(21) Appl. No.: 14/732,630

(22) Filed: Jun. 5, 2015

(65) Prior Publication Data
US 2015/0270532 A1 Sep. 24, 2015

Related U.S. Application Data

(62) Division of application No. 12/535,632, filed on Aug. 4, 2009, now abandoned.
(Continued)

(51) Int. Cl.
*H01M 4/04* (2006.01)
*H01M 4/13* (2010.01)
(Continued)

(52) U.S. Cl.
CPC ........... *H01M 4/0404* (2013.01); *B29C 59/02* (2013.01); *B29C 59/16* (2013.01); *B82Y 30/00* (2013.01);
(Continued)

(58) Field of Classification Search
None
See application file for complete search history.

(56) References Cited

U.S. PATENT DOCUMENTS 6,022,590 A    2/2000  Ferguson et al.
6,442,743 B1 * 8/2002  Sarrafzadeh ........ G06F 17/5072
                                            716/122
(Continued)

FOREIGN PATENT DOCUMENTS

CN      1901255     1/2007
JP      62-122057   6/1987
(Continued)

OTHER PUBLICATIONS

Chan et al., High-performance lithium battery anodes using silicon nanowires, Dec. 16, 2007, Nature Publishing Group, vol. 3, pp. 31-35. (Year: 2007).*
(Continued)

*Primary Examiner* — Jonathan Crepeau
*Assistant Examiner* — Angela J Martin
(74) *Attorney, Agent, or Firm* — Morrison & Foerster LLP (57) ABSTRACT

Electrochemical cells or batteries featuring functional gradations, and having desirable, periodic configurations, and methods for making the same. One or more methods, in alone or in combination, are utilized to fabricate components of such electrochemical cells or batteries, which are designed to achieve certain thermal, mechanical, kinetic and spatial characteristics, and their effects, singly and in all possible combinations, on battery performance. The thermal characteristics relate to temperature distribution during charge and discharge processes. The kinetic characteristics relate to rate performance of the cells or batteries such as the ionic diffusion process and electron conduction. The mechanical characteristics relate to lifetime and efficiency of the cells or batteries such as the strength and moduli of the component materials. Finally, the spatial characteristics relate to the energy and power densities, stress and tempera- (Continued)

ture mitigation mechanisms, and diffusion and conduction enhancements. The electrochemical cells or batteries constructed according to the methods presented in this invention are useful for all applications that require high rate performance, high energy/power density, good durability, high safety and long lifetime.

22 Claims, 7 Drawing Sheets

Related U.S. Application Data (60) Provisional application No. 61/086,161, filed on Aug. 5, 2008.

(51) Int. Cl.

| H01M 4/38 | (2006.01) |
|---|---|
| H01M 4/70 | (2006.01) |
| H01M 4/139 | (2010.01) |
| C23C 14/08 | (2006.01) |
| C23C 14/04 | (2006.01) |
| C23C 14/02 | (2006.01) |
| B82Y 30/00 | (2011.01) |
| C23C 4/134 | (2016.01) |
| B29C 59/02 | (2006.01) |
| B29C 59/16 | (2006.01) |
| C23C 14/22 | (2006.01) |
| C23C 14/48 | (2006.01) |
| C23C 16/44 | (2006.01) |
| C23C 16/455 | (2006.01) |
| C23C 16/511 | (2006.01) |
| H01M 4/02 | (2006.01) |
| H01M 4/505 | (2010.01) |
| H01M 4/131 | (2010.01) |
| H01M 4/134 | (2010.01) |
| H01M 10/0565 | (2010.01) |
| H01M 10/6554 | (2014.01) |
| H01M 10/613 | (2014.01) |

(52) U.S. Cl.
CPC ............ *C23C 4/134* (2016.01); *C23C 14/025* (2013.01); *C23C 14/042* (2013.01); *C23C 14/08* (2013.01); *C23C 14/22* (2013.01); *C23C 14/48* (2013.01); *C23C 16/44* (2013.01); *C23C 16/45525* (2013.01); *C23C 16/511* (2013.01); *H01M 4/0407* (2013.01); *H01M 4/0419* (2013.01); *H01M 4/0423* (2013.01); *H01M 4/0426* (2013.01); *H01M 4/0428* (2013.01); *H01M 4/0471* (2013.01); *H01M 4/13* (2013.01); *H01M 4/139* (2013.01); *H01M 4/382* (2013.01); *H01M 4/70* (2013.01); *H01M 4/131* (2013.01); *H01M 4/134* (2013.01); *H01M 4/505* (2013.01); *H01M 10/0565* (2013.01); *H01M 10/613* (2015.04); *H01M 10/6554* (2015.04); *H01M 2004/021* (2013.01); *H01M 2004/025* (2013.01)

(56) References Cited

U.S. PATENT DOCUMENTS

| 6,680,143 | B2 | 1/2004 | Thackeray et al. | |
| 6,982,132 | B1* | 1/2006 | Goldner | E06B 9/24 |
| | | | | 204/192.11 |
| 7,090,891 | B2* | 8/2006 | Anderson | H01M 4/9066 |
| | | | | 427/115 |
| 7,341,774 | B2 | 3/2008 | Kalkan et al. | |
| 2003/0027033 | A1 | 2/2003 | Seabaugh et al. | |
| 2003/0082446 | A1 | 5/2003 | Chiang et al. | |
| 2003/0099884 | A1 | 5/2003 | Chiang et al. | |
| 2004/0131934 | A1* | 7/2004 | Sugnaux | B82Y 20/00 |
| | | | | 429/209 |
| 2004/0265690 | A1* | 12/2004 | Chen | H01M 4/04 |
| | | | | 429/209 |
| 2006/0057354 | A1 | 3/2006 | Kalkan et al. | |
| 2006/0141137 | A1 | 6/2006 | Anderson et al. | |
| 2006/0275668 | A1 | 12/2006 | Peres et al. | |
| 2007/0036978 | A1* | 2/2007 | Chen | B22F 7/08 |
| | | | | 428/408 |
| 2007/0059573 | A1 | 3/2007 | Debe et al. | |
| 2007/0202403 | A1 | 8/2007 | Oh et al. | |
| 2008/0044685 | A1* | 2/2008 | Jin | B22F 1/0018 |
| | | | | 428/627 |
| 2008/0044732 | A1 | 2/2008 | Salot et al. | |
| 2008/0128021 | A1 | 6/2008 | Choudhury et al. | |
| 2009/0017371 | A1 | 1/2009 | Nakamura | |
| 2009/0032394 | A1 | 2/2009 | Wu et al. | |
| 2009/0326696 | A1 | 12/2009 | Wang et al. | |
| 2011/0169193 | A1 | 7/2011 | Bonassar et al. | |

FOREIGN PATENT DOCUMENTS

| JP | 2001-151834 | 6/2001 |
|---|---|---|
| JP | 2004-273443 | 9/2004 |
| JP | 2004-533702 | 11/2004 |
| JP | 2005-93373 | 4/2005 |
| JP | 2005-183366 | 7/2005 |
| JP | 2006-185800 | 7/2006 |
| JP | 2007-149648 | 6/2007 |
| JP | 2008-527652 | 7/2008 |
| JP | 2009-538495 | 11/2009 |
| WO | WO-2005/101973 | 11/2005 |
| WO | WO-2008/059740 | 5/2008 |
| WO | WO-2008/086041 | 7/2008 |

OTHER PUBLICATIONS

Wang et al., Carbon-MEMS architectures for 3D microbatteries, 2004, Proceeding of the SPIE 5455, MEMS, MOEMS, and Micromachining, vol. 5455, Aug. 16, 2004, SPIE, 8 pp. (Year: 2004).*
International Search Report and Written Opinion dated Oct. 5, 2009, directed to International Application No. PCT/US2009/052745; 16 pages.
Extended European Search Report dated Mar. 3, 2014, directed to EP Application No. 09805459.6; 15 pages.
Sastry et al., U.S. Office Action dated Oct. 28, 2010, directed to U.S. Appl. No. 12/535,632; 8 pages.
Sastry et al., U.S. Office Action dated May 12, 2011, directed to U.S. Appl. No. 12/535,632; 15 pages.
Sastry et al., U.S. Office Action dated Jan. 30, 2012, directed to U.S. Appl. No. 12/535,632; 14 pages.
Sastry et al., U.S. Office Action dated Jul. 5, 2012, directed to U.S. Appl. No. 12/535,632; 12 pages.
Sastry et al., U.S. Office Action dated Nov. 29, 2013, directed to U.S. Appl. No. 12/535,632; 12 pages.
Sastry et al., U.S. Office Action dated May 16, 2014, directed to U.S. Appl. No. 12/535,632; 15 pages.
Sastry et al., U.S. Office Action dated Mar. 12, 2015, directed to U.S. Appl. No. 12/535,632; 14 pages.
Sastry et al., U.S. Office Action dated Sep. 17, 2015, directed to U.S. Appl. No. 12/535,632; 15 pages.
Dictionary.com. (2011) "Grade," located at <http://dictionary.reference.com/browse/graded> visited on May 2, 2011. (3 pages).
Thackeray, M.M et al. (2007). "$Li_2MnO_3$-stablized $LiMO_2$ (M=Mn, Ni, Co) Electrodes for Lithium-Ion Batteries," Journal of Material Chemistry 17:3112-3125.

* cited by examiner

ELECTROCHEMICAL CELL INCLUDING FUNCTIONALLY GRADED AND ARCHITECTURED COMPONENTS AND METHODS

CROSS-REFERENCES TO RELATED APPLICATIONS

This divisional Application claims priority to U.S. application Ser. No. 12/535,632, filed on Aug. 4, 2009, which claims priority to U.S. Provisional Patent Application No. 61/086,161, filed on Aug. 5, 2008, the disclosure of which is hereby incorporated by reference for all purposes.

BACKGROUND OF THE INVENTION

The present invention relates generally to electrochemical cells. More particularly, the present invention provides methods and devices having a functionally graded and an architectured component for electrode(s). Merely by way of example, the invention can be applied to a variety of applications including automotive, telecommunication, general energy storage, portable electronics, power tools, power supplies, among others.

As noted, electrochemical cells are used to store energy for a variety of applications. These applications include portable electronics such as cell phones, personal digital assistants, music players, video cameras, and the like. Applications also include power tools, power supplies for military use (e.g., communications, lighting, imaging and the like), power supplies for aerospace applications (e.g., power for satellites), and power supplies for vehicle applications (e.g., hybrid electric vehicles, plug-in hybrid electric vehicles, and fully electric vehicles), and others.

Conventional electrochemical cells are manufactured using paper-making techniques. The conventional electrochemical cells have been fabricated without accounting for internal mechanical stresses, intercalation and thermal induced stresses. Thus, drawbacks exist with these conventional cells. The drawbacks include limited lifetime, premature failure, limited storage capability, and other imperfections. To increase the electrochemical cell energy and power density, without compromising lifetime, other manufacturing approaches have been proposed. Concurrently, electrode architectures have been developed that use thin-film, microarchitectured, functionally graded materials such as $Li_2MnO_3$-stabilized $LiMO_2$ (M=Mn, Ni, Co) described in "M. M. Thackeray, S. H. Kang, C. S. Johnson, $Li_2MnO_3$-stabilized $LiMO_2$ (M=Mn, Ni, Co) Electrodes for Lithium-Ion Batteries, Journal of Material Chemistry 17, 3112-3125, 2007". This type of cells typically has non-aqueous electrolyte sandwiched between a cathode layer and an anode layer of similar geometry. For example, in a typical thin-film lithium ion cell, the cathode is often, $LiCoO_2$, $LiMn_2O_4$, while the electrolyte is often lithium-phosphorous-oxynitride (LIPON) and anode is lithium foil. Thin-film Li-ion cells have been demonstrated to have energy densities of 1,000 Wh/Kg and power densities of 10,000 W/Kg with potentially unlimited number of discharge-charge cycles.

A central challenge to create cost-effectively microarchitectured and functionally graded electrodes, cells or batteries is precisely tuning material properties for the specific role of that material needed. In order to achieve precise material properties spanning through an electrochemical cell manufacturing has to be inside a controlled environment. Traditional thin-film electrochemical cells have been manufactured inside the clean room for aerospace and implantable batteries. However, such a process is too costly and can not be used for mass production of high-tech electrochemical cells.

As a consequence, cost-effective high throughput manufacturing techniques and microarchitectured and functionally graded electrodes are desirable.

SUMMARY OF THE INVENTION

According to the present invention, techniques for electrochemical cells are provided. More particularly, the present invention provides methods and devices having a functionally graded and an architectured component for electrode(s). Merely by way of example, the invention can be applied to a variety of applications including automotive, telecommunication, general energy storage, portable electronics, power tools, power supplies, among others.

Embodiments of the present invention comprise a microarchitectured thin-film electrochemical cell with continuously deposited layers that have varying at least one of (or more) intensive properties as a function of at least one of (or more) the extensive properties, and related methods to manufactured such type of electrochemical cell. The intensive properties are, but are not limited to, density, composition, concentration, thermal/electronic/ionic conductivities, thermal/ionic diffusivities, maximum strain, ultimate strength, moduli, ductility, and plasticity, combinations, and the like. Also, the extensive properties are, but are not limited to, volume, area, and thickness, combinations, and the like.

Merely by way of example, the invention has been provided with use of lithium based cells, but it would be recognized that other materials such as zinc, silver, copper and nickel could be designed in the same or similar fashion. Deposition of layers and formation of microarchitecture of layers are accomplished by one of several processes, used separately or in conjunction with one another. Continuous manufacturing of electrodes and batteries is accomplished via a variety of techniques. The manufacturing processes of the present invention is finished inside the deposition chamber, which is equipped with sufficient materials to create complete batteries, via deposition of anode, cathode, electrolyte, separator and current collector layers. As used herein, the term "continuous process" shall mean a substantially free from any breaks or each of the processes is within a predetermined environment, e.g., vacuum. Batteries constructed using this approach have at least one anode, one cathode, an electrolyte, and may have a separator, depending upon the electrochemistry used. Of course, there can be other variations, modifications, and alternatives.

An embodiment of the present invention, one or more material is provided that comprises a microarchitectured morphology having at least one mechanism to mitigate intercalation and thermal expansion stresses, strengthen the electrode material.

In another embodiment of the present invention, one or more material is provided that comprises a functionally graded structure having one or more intensive properties varying as function of one or more extensive properties of the material. Intensive characteristics include but are not limited to density, composition, concentration, thermal/electronic/ionic conductivities, thermal/ionic diffusivities, maximum strain, ultimate strength, moduli, ductility, and plasticity. Extensive characteristics include but are not limited to volume, area, and thickness.

In yet another embodiment of the present invention, an anode material is provided that having a composition containing at least one element from Groups IA, IVA, VIA, and IIB; a cathode material is provided that having a composition containing at least one element from Groups IA, VIII, IVA, VIA, IB, IVB and VIIB;

In a still another embodiment of the present invention, microarchitecture is created using one or more of the following techniques. The anode current collector material is formed on a microarchitectured substrate by using physical vapor deposition techniques, or is a stand-alone microarchitectured film without needing a substrate. The cathode current collector material is formed on a microarchitectured substrate by using physical vapor deposition techniques, or it is a stand-alone microarchitectured film without requiring a substrate. The microarchitectured electrochemical cell comprises anode, electrolyte and cathode deposited sequentially or in reverse order by physical vapor deposition techniques. As used herein, the term "microarchitectured" shall be interpreted by ordinary meaning and the description herein should not be limiting. As an example, the term microarchitectured shall include feature sizes ranging from about 100 nanometers to about 100 micrometers and less than 500 micrometers, but can be others.

In another embodiment of the present invention, a method is provided that comprises of manipulating the configuration of the electrode to create breadloafing. The anode connected with the anode current collector and a second side is interlocked with the electrolyte. The electrolyte of present invention, wherein a first side is interlocked with the anode layer and a second side is interlocked with the cathode layer. The cathode of claim 1, wherein a first side is interlocked with the electrolyte and a second side is connected with the cathode current collector.

In another embodiment of the present invention, methods are provided that comprise of manipulating the materials to form nanocomposite electrode. A nanocomposite architecture of the cathode material to neutralize internal stresses, stop crack growth, maximize material strength, and stabilize active material structure. A nanocomposite material is formed by depositing two or more layers of same material with different crystal structures. In one embodiment, a nanocomposite material is formed by depositing two or more layers of the same material with different crystal structures, and using masks on alternate layers to create patterns. In another embodiment, a nanocomposite material is formed by depositing two or more layers of different materials. In yet another embodiment, a nanocomposite material is formed by depositing two or more layers of different materials, and using masks on alternate layers to create patterns. In yet another embodiment, a nanocomposite material is formed by depositing two or more materials at the same time to create one or more nanodisperse phases within the main matrix grains of active material. In another embodiment, a nanocomposite material is formed by depositing two or more materials at the same time to create dispersion of secondary phases around the grain boundaries of the matrix of active material. In yet another embodiment, a nanocomposite material is formed by depositing two or more materials at the same time to create a dispersion of secondary phases both inside and around the grains of the matrix of active material. In another embodiment, a nanocomposite material is formed by depositing two or more materials at the same time to induce phase separation. As used herein, the term nanocomposite shall include feature sizes ranging from about 50 Å to about 500 nanometers and less, but can be other sizes according to ordinary meaning.

In another embodiment of the present invention, methods are provided that comprise of fabricating the functionally graded, microarchitectured solid electrodes using a plurality of techniques containing at least one from the group of evaporation, physical vapor deposition (PVD), chemical vapor deposition, sputtering, radio frequency magnetron sputtering, microwave plasma enhanced chemical vapor deposition (MPECVD), pulsed laser deposition (PLD), laser ablation, spray deposition, spray pyrolysis, spray coating or plasma spraying, and fabricating functionally graded, microarchitectured nonaqueous electrolyte using a plurality of techniques containing at least one from the group of physical vapor deposition, laser deposition, centrifuge, spinning, microwave, thermal control, spray, and chemical vapor deposition.

In another embodiment of the present invention, methods are provided that comprise of masking, and deposition to define a precise morphology of active region for neutralizing internal stresses, stopping crack growth, maximizing material strength, and stabilizing active material structure in anode, electrolyte, cathode and current collectors.

In another embodiment of the present invention, methods are provided that morphology of periodic, irregular but not arbitrary electrode is identified by using one of the optimization techniques, but not limited to, surrogate-base analysis, genetic algorithm, adaptive topology optimization, design of experiments, ANOVA/MANOVA, basin based analysis, solid isotropic microstructure with intermediate mass penalization (SIMP), power penalized stiffness model, topology optimization of continuum structure, normal boundary intersection (NBI) optimization method, multivariable optimization method, or multidisciplinary design optimization.

In another embodiment of the present invention, methods are provided that comprise of preparing microarchitectured electrodes. The microarchitectured electrode is characterized by periodic pattern by using a patterning technique selected from a group including but not limited to: periodically varying magnetic field, electric field, temperature gradient, and optical beam intensity, periodically seeding the current collector or substrate with precursor, periodically modifying the current collector or substrate using drilling, masking, molding, indentation, nanoimprint, abrasive, laser ablation, radiation and neutron scattering.

In a specific embodiment, the various cell elements can be formed using one or more techniques. These techniques include evaporation, physical vapor deposition (PVD), chemical vapor deposition, low pressure chemical vapor deposition (LPCVD), atomic layer deposition (ALD), direct laser writing (DLW), sputtering, radio frequency magnetron sputtering, microwave plasma enhanced chemical vapor deposition (MPECVD), pulsed laser deposition (PLD), nanoimprint, ion implantation, laser ablation, spray deposition, spray pyrolysis, spray coating or plasma spraying. Of course, there can be other variations, modifications, and alternatives.

Moreover, the present invention provides a micro-architectured electrochemical cell and/or battery device. The cell and/or battery device includes an anode and a cathode arranged anti-symmetrically with the anode. In a specific embodiment, the device has a predetermined distance between the cathode and the anode. An electrical insulation is provided to separate the anode from the cathode. In a specific embodiment, the electrical insulation is characterized by a graded material property that changes within a portion of the predetermined distance or one or more layers of insulating material to separate the anode from the cathode. In a specific embodiment, the device has a nanocomposite anode material characterizing the anode. In a preferred embodiment, the nanocomposite anode material has one or more first intensive characteristics that is a function of one or more second extensive characteristics. A nanocomposite cathode material characterizes the cathode. In a specific embodiment, the nanocomposite cathode material has one or more first intensive characteristics that is a function of one or more second extensive characteristics. In a specific embodiment, an electrolyte material is provided between the anode and the cathode. In a specific embodiment, the device has a cathode current collector in communication with the cathode and an anode current collector in communication with the anode.

Still further, the present invention provides an electrochemical cell. The cell has an anode member having one or more first spatial features and formed substantially from a first nanocomposite material, which has an average feature size ranging from about 50 Å to about 500 nanometers. In a specific embodiment, the first nanocomposite material has a first resistivity value of greater than 8 micro-ohms centimeters, but can be others. In a specific embodiment, the cell has a cathode member having one or more second spatial features. The cathode member is operably coupled the anode member and is formed substantially from a second nanocomposite material, which has an average feature size ranging from about 50 Å to about 500 nanometers. In a specific embodiment, the second nanocomposite has a second resistivity value of greater than 14.3 ohms centimeters, but can be others. In a specific embodiment, the device has a predetermined gap between the anode and the cathode. In a specific embodiment, the predetermined gap is greater than 500 nanometers. The device also has an electrolyte provided between the anode and the cathode and a separator provided between the anode and the cathode. The device has a first current collector coupled to the anode via at least a first contact and a second current collector coupled to the cathode via at least a second contact.

Still further, the present invention provides a method for fabricating an electrochemical cell. The method includes providing a substrate member having a predetermined spatial pattern, e.g., patterned, periodic. The method includes depositing a first thickness of material using one or more species overlying the predetermined spatial pattern in a conformal manner. In a specific embodiment, the first thickness of material is characterized as a nanocomposite structure having an average feature size of about 500 nanometers and less. The method includes adjusting one or more parameters related to the deposition during a time period associated with the deposition of the first thickness of material from a first spatial region of the first thickness of material to a second spatial region of the first thickness of material to form a first electrode element having a graded feature of one or more characteristics from the first spatial region to the second spatial region. The method forms an electrolyte overlying the first electrode element and forms a second electrode element overlying the electrolyte.

In an alternative specific embodiment, the present invention provides a method for fabricating an electrode for an electrochemical cell. The method includes providing a substrate member comprising a current collector. The method includes depositing a thickness of material using one or more species overlying a surface region of the substrate member. In a specific embodiment, the thickness of material is characterized as a nanocomposite material. The method includes adjusting one or more parameters during a time period associated with the depositing of the thickness of material from a first spatial region of the thickness of material to a second spatial region of the thickness of material. The method also includes causing formation of an electrode element having a graded feature of one or more characteristics from the first spatial region to the second spatial region.

Moreover, the present invention provides a method for fabricating a periodic geometric feature for an electrochemical cell. The method includes masking and exposing a region of substrate for an electrode member or current collector by periodically varying one or more parameters selected from at least a magnetic field, an electric field, a temperature gradient, and an optical beam intensity to seed the exposed region of the substrate with one or more precursors. In other embodiments, the method also includes periodically modifying one or more spatial regions of the exposed region of the substrate using at least one or more processes selected from drilling, masking, molding, indentation, nanoimprint, abrasive, laser ablation, radiation and neutron scattering. Of course, there can be other variations, modifications, and alternatives.

The benefits of the invention include the ability it confers in rational design and combination of multiple materials to produce electrochemical cells, in novel arrangements. These in, turn, confer superior properties to designed cells, and elimination of costly-trial and error in construction of prototype cells. Depending upon the embodiment, one or more of these benefits can be achieved.

DETAILED DESCRIPTION OF SPECIFIC EMBODIMENTS

According to the present invention, techniques relate to manufacture of three-dimensional interdigitated electrochemical cells. More particularly, the present invention provides a method and system for manufacture of three-dimensional elements for three-dimensional interdigitated electrochemical cells. Merely by way of example, the invention has been provided with use of lithium based cells, but it would be recognized that other materials such as zinc, silver, copper and nickel could be designed in the same fashion. Additionally, such batteries can be used for a variety of applications such as portable electronics (cell phones, personal digital assistants, music players, video cameras, and the like), power tools, power supplies for military use (communications, lighting, imaging and the like), power supplies for aerospace applications (power for satellites), and power supplies for vehicle applications (hybrid electric vehicles, plug-in hybrid electric vehicles, and fully electric vehicles). The design of such batteries is also applicable to cases in which the battery is not the only power supply in the system, and additional power is provided by a fuel cell, other battery, IC engine or other combustion device, capacitor, solar cell, etc. Of course, there can be other variations, modifications, and alternatives.

It is to be understood that both the forgoing general description and the following detailed description are exemplary and explanatory only and are not restrictive of the invention, as claimed. It may be noted that, as used in the specification and the appended claims, the singular forms "a", "an", and "the" include plural referents unless the context clearly dictates otherwise. Thus, for example, reference to "a material" may include mixture of materials; reference to "a compound" may include multiple compounds.

Figure 1:
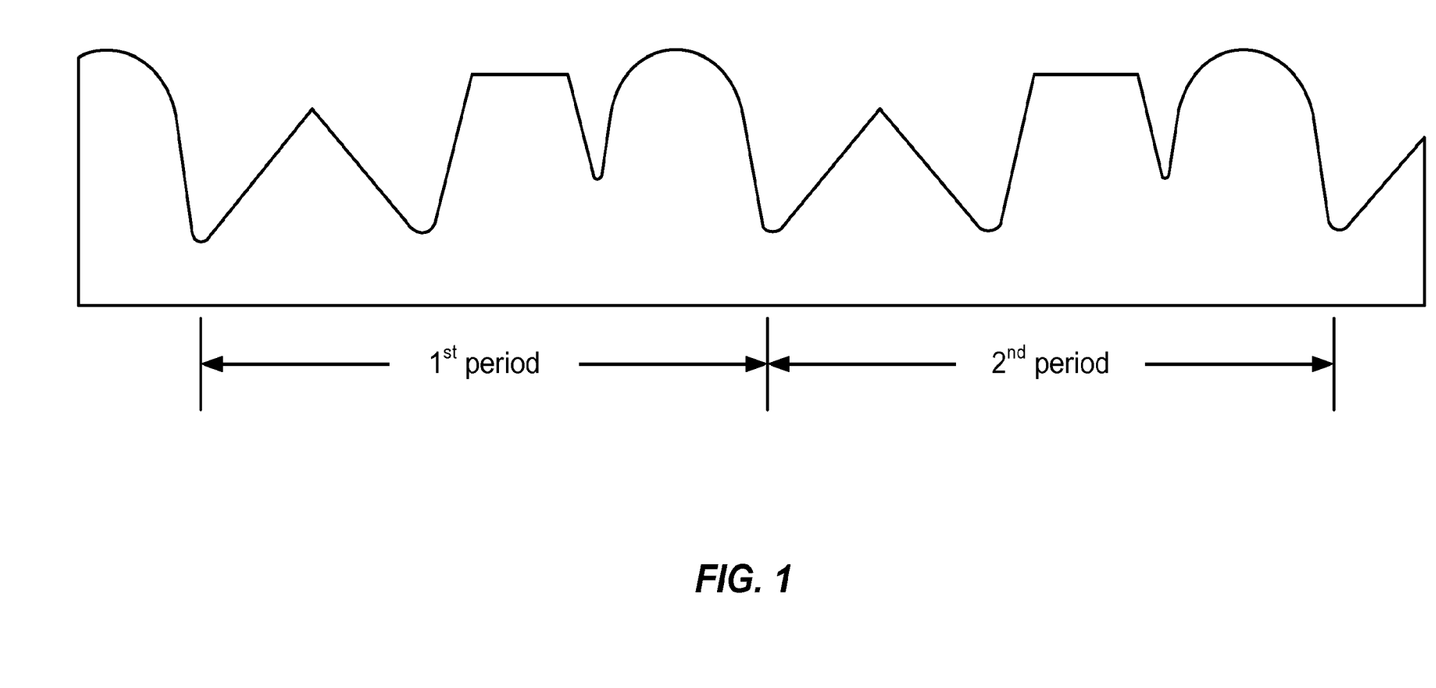
FIG. 1 Periodic, irregular but not arbitrary electrode according to an embodiment of the present invention.

In a specific embodiment, the present invention provides a structure that is irregular in shape, but has a periodic spatial feature. In a preferred embodiment, the irregularity is not arbitrary in shape or size. The irregularity has a predetermined spatial feature. As shown in FIG. 1, the structure has a first periodic spatial feature domain and a second periodic spatial feature domain. In a specific embodiment, each of the domains include common features, which may include a pyramidal shape, trapezoidal shape, dome shape, or any other shapes, including combinations, and the like. Of course, there can be other variations, modifications, and alternatives.

In a specific embodiment of the present invention, a device of electrochemical cells comprises of functionally graded and periodically spatial feature electrodes that would benefit its usage to extend lifetime and efficiency by mitigating the stress due to the ionic intercalation, alleviating thermal stress due to the electrochemical reaction, stabilizing the host material lattice structure during the charge-discharge process, and increasing the kinetic properties of the host material. The electrode described herein is referring to anode and cathode of a single electrochemical cell. The anode and cathode referring herein are based on the electric current direction and the mode. Therefore, the anode is the negative terminal in a discharge electrochemical cell (or also known as galvanic cell), but it would the positive terminal in a recharging electrochemical cell (or also known as electrolytic cell). The cathode is vice versa. The functionally graded electrodes described herein are characterized by the variation in composition and structure gradually over spatially volume of single electrode or whole electrochemical cells. The periodically spatial feature of electrodes or electrochemical cells of the device described herein is employed to strengthen material performance locally to facilitate the ionic diffusion, electronic conduction, and mitigating stress inside the electrodes.

One advantage of using functionally graded electrode is that a specific function of a material is integrated with the host active material so that the benefit of that specific function would be added to improve overall electrode performance. The host active material referring herein is the material within an electrode responsible for the electronic energy exchange with counter electrode during the electrochemical reaction. The function described herein includes, but not limited to, mitigating intercalation stress due to the host material lattice increment, alleviating thermal stress due to the energy exchange within the whole device, and increasing the kinetic properties of the electrode in specific region, etc. For example, utilizing $Li_2MnO_3$ will stabilize $LiMO_2$ lattice structure, where M include Mn, Ni and Co, during the charge-discharge process in a Li ion battery as described in U.S. Pat. No. 6,680,143 B2. But in this patent, the function of stabilizing lattice structure of the host active material is the only one.

In another embodiment of the present invention, a method is provided that periodically spatial feature of the electrode is identified as shown in FIG. 1. As shown, the diagram includes a first period and a second period according to a specific embodiment. In a specific embodiment, each of the periods includes various shapes, e.g., pyramid, trapezoid, dome. The spatial feature of the electrode has impacts on the cell performance, such as mitigating stresses due to Li+ intercalation and temperature increment, etc. The preferred spatial feature will be identified by utilizing any optimization techniques. The optimization method comprises one technique from, but not limited to, the group of surrogate-base analysis, genetic algorithm, adaptive topology optimization, design of experiments, ANOVA/MANOVA, basin based analysis, solid isotropic microstructure with intermediate mass penalization (SIMP), power penalized stiffness model, topology optimization of continuum structure, normal boundary intersection (NBI) optimization method, multivariable optimization method, or multidisciplinary design optimization. A preferred embodiment of the present invention would be having a sinusoidal electrode profile, wherein the amplitude and frequency of the sinusoid will be determined by the optimization techniques listed above to have robust performance, long lifetime, and high safety. Of course, there can be other variations, modifications, and alternatives.

In certain embodiments of the present invention the atmosphere associated with the electrode material deposition may be changed. In one embodiment, the suitable atmosphere comprises a oxygen atmosphere to create metal oxide materials. In other embodiments the atmosphere may be a nitrogen atmosphere to create electrolyte layers or nitride materials.

In some embodiments of the present invention the temperature associated to the electrode materials formation may be varied, continuously or step-wise to achieve particular materials microstructures. In one embodiment an annealing step up to 800° C. may be introduced to induce re-crystallization of amorphous metal oxides material layers.

In other embodiments ambient temperature may be maintained constant by cooling the substrate and removing heat at a constant rate.

In some embodiments of the present invention, architectured components of the battery, having geometric features ranging from 100 nanometers to 100 micrometers or below 500 micrometers, may be fabricated using any suitable technique from the following list, individually or in combination with each other: evaporation, physical vapor deposition (PVD), chemical vapor deposition, low pressure chemical vapor deposition (LPCVD), atomic layer deposition (ALD), direct laser writing (DLW), sputtering, radio frequency magnetron sputtering, microwave plasma enhanced chemical vapor deposition (MPECVD), pulsed laser deposition (PLD), nanoimprint, ion implantation, laser ablation, spray deposition, spray pyrolysis, spray coating or plasma spraying. Of course, there can be other variations, modifications, and alternatives.

In another embodiment of the present invention, preferred materials for each member include, but not limited to, a substrate material comprising of copper (Cu), aluminum (Al), stainless steel, or other suitable conductive alloy in the form of a thin foil and bearing, an anode material comprising lithium metal (Li), lithium titanium oxide ($Li_4Ti_5O_{12}$), graphite (C), or meso-carbon structures such as microbeads or other microstructures; an electrolyte material overlying the first electrode material and comprising lithium phosphorus oxynitride (LIPON), lithium salts such as $LiClO_4/LiPF_6$ mixed with poly-ethylene oxide (PEO), poly-vinylidene fluoride (PVDF), or combination of PEO and PVDF; and a cathode material overlying the electrolyte material and comprising layered metal oxide materials such as $LiCoO_2$, spinel materials such as $LiMn_2O_4$, olivine materials such as $LiFePO_4$, $Li(Ni_{1/3}Mn_{1/3}Co_{1/3})O_2$, $LiNixCoyAl_{(1-x-y)}O_2$ (NCA), $LiNi_xMn_yCo_{(1-x-y)}O_2$ (NCM). Further details of the methods and devices can be found throughout the present specification and more particularly below. The following descriptions are merely examples, which should not unduly limit the scope of the claims herein. One of ordinary skill in the art would recognize other variations, modifications, and alternatives.

Example 1

A Functionally Graded Electrode and its Manufacturing Technique

Figure 2A:
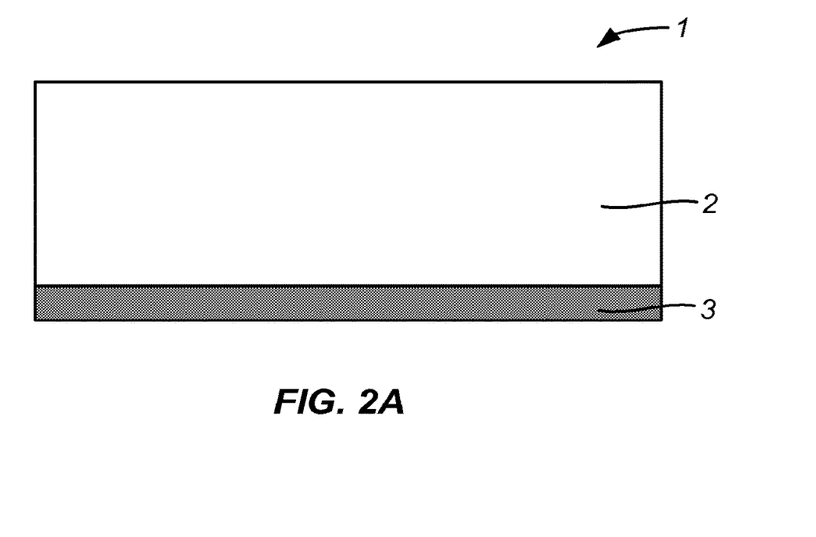
FIGS. 2(A)-(B) are simplified cross-sectional views showing fabrication of a functionally graded electrode according to an embodiment of the present invention.
Figure 2B:
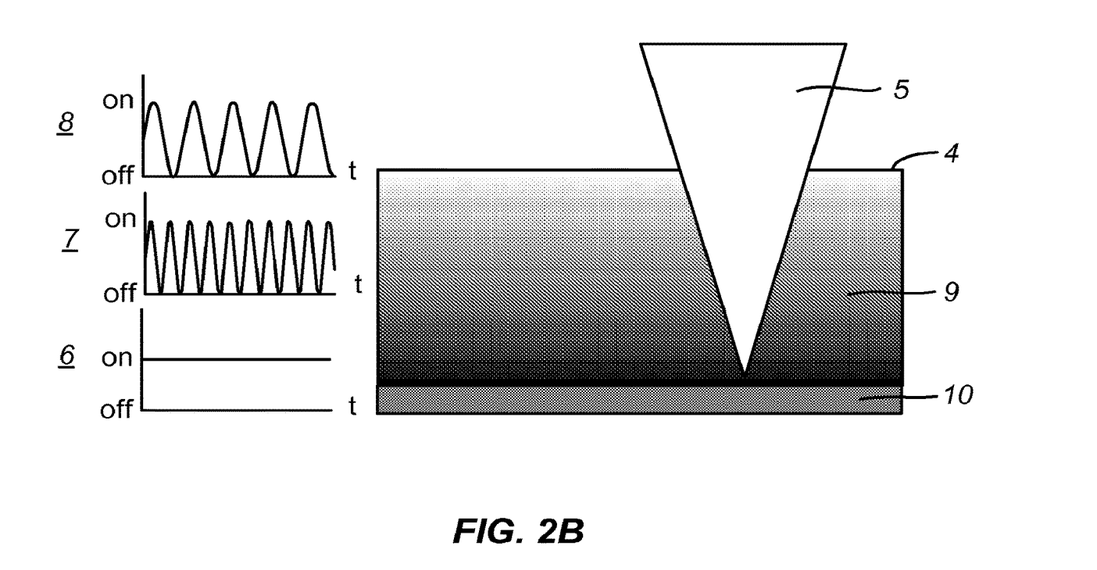

In FIGS. 2A and 2B, a functionally graded graphite anode is created by focusing a laser beam through polymer electrolyte layer by layer gradually from current collector to some desired distance toward the surface of the polymer electrolyte with decreasing the frequency of turning on-and-off the laser beam as the focus point of the laser beam is gradually moved away from the current collector. The electrode 1 comprises of polymer electrolyte ($LiPF_6$ plus polyethyleneoxide, PEO) 2 coated on top of copper current collector 3 as detailed described in FIG. 2A. Because of the high-energy of the Nd:YAG laser beam 4, the polymer in polymer electrolyte, where the laser beam is aimed, will be graphitized as 9 in FIG. 2B. Also, because of decreasing the frequency of turning on-and-off the laser beam (as shown in 6 to 8 in FIG. 2B), the area of graphitized polymer in one layer will be decreased. Hence, concentration of the graphite-like electrode will be gradually decreased moving away from the current collector as 9 illustrated FIG. 2B. The strength of color black 9 indicates the concentration of graphite. Of course, there can be other variations, modifications, and alternatives.

Example 2

Manufacturing of a Microarchitectured Electrode

Figure 3A:
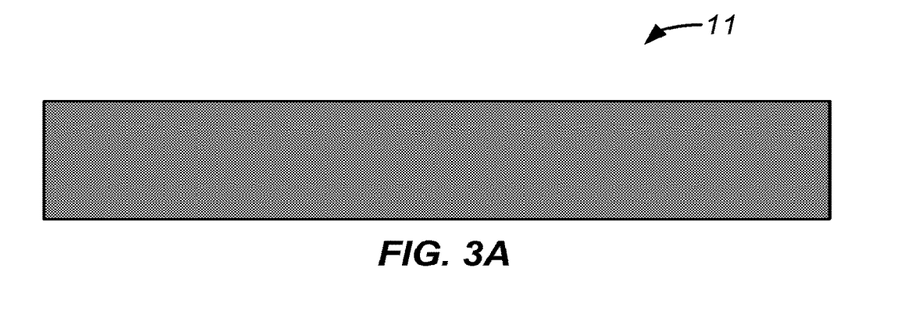
FIGS. 3(A)-(C) are simplified cross-sectional views showing fabrication of an electrode exhibiting a sinusoidal microarchitecture according to an embodiment of the present invention.
Figure 3B:
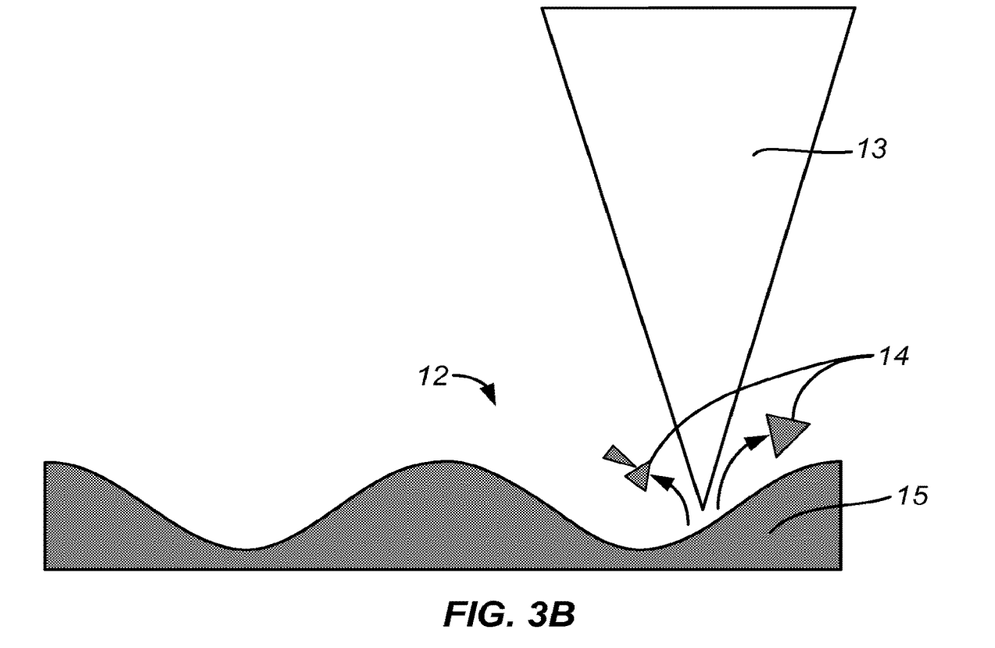
Figure 3C:
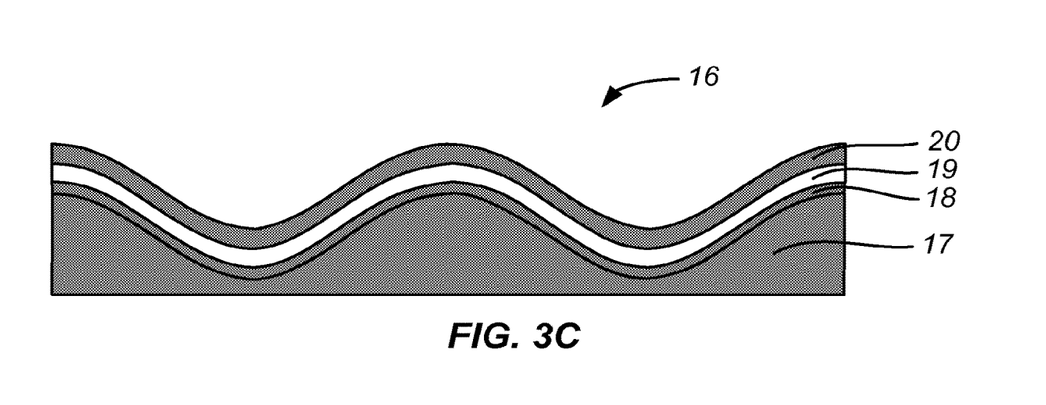

In FIGS. 3A, B, and C, a microarchitectured $LiMn_2O_4$ cathode having a periodic but non-arbitrary geometry is made using a silicon (Si) substrate 11 as a template. A Nd:YAG laser 13 is used to machine the substrate and remove material 14, creating a set of channels and ridges that follows a predetermined geometry obtained using a Computer Aided Design (CAD) software as 12. The design is reflecting minimization of intercalation stresses in the $LiMn_2O_4$ material according to computer simulations. Once the substrate machining is completed conformal material layers are deposited using physical vapor deposition (PVD) onto the substrate. Respectively, a first titanium (Ti) 18 attachment layer, having a thickness of 50 Å or less, followed by a second aluminum (Al) layer 19, having a thickness of 500 nanometers or higher, to serve as cathode current collector. After deposition of the current collector, the active material ($LiMn_2O_4$) 20 is formed following the same geometry imprinted by the substrate. The thickness of the active material is 1-10 µm. Of course, there can be other variations, modifications, and alternatives.

Example 3

Manufacturing of a Nanocomposite Material for Electrode

Figure 4A:
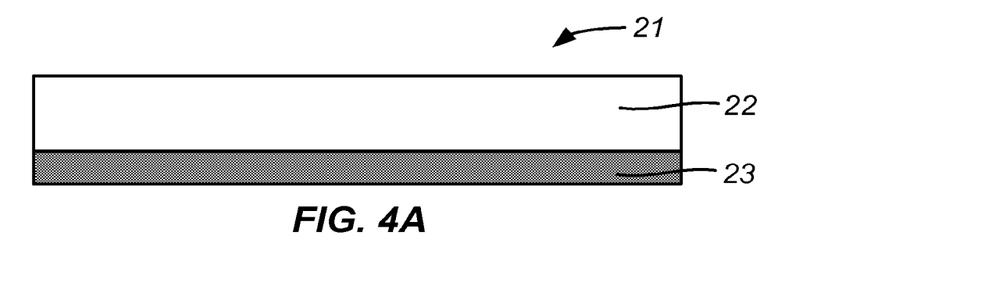
FIGS. 4(A)-(D) are simplified cross-sectional views showing fabrication of an electrode exhibiting a nanocomposite material for electrode according to an alternative embodiment of the present invention.
Figure 4B:
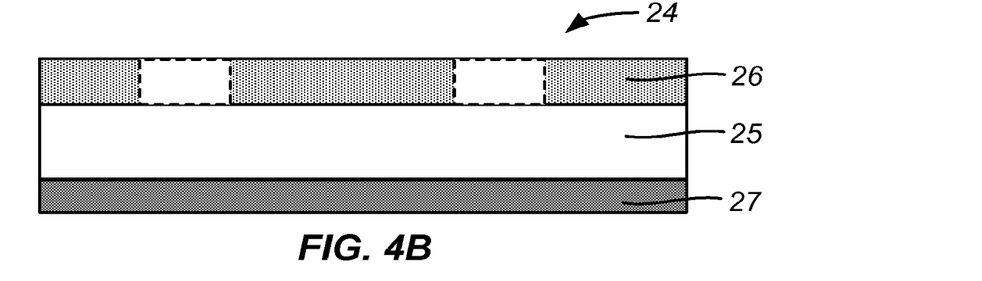
Figure 4C:
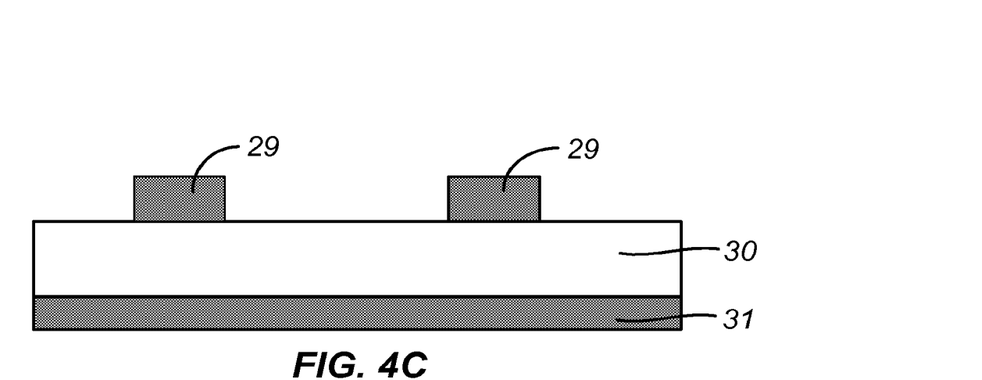
Figure 4D:
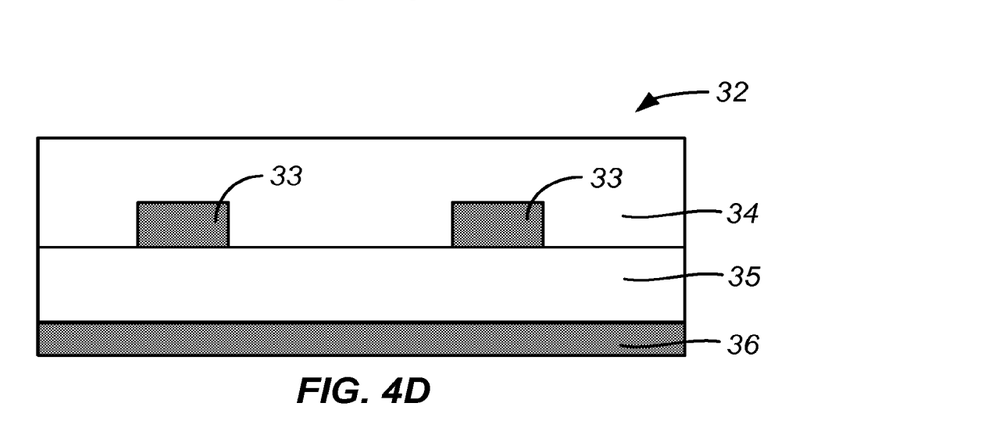

In FIGS. 4A, B, C, and D, a $LiMn_2O_4$ partially stabilized cathode is fabricated by depositing conformal material layers using physical vapor deposition (PVD). The same procedure illustrated here can be used with or without the pre-existence of a substrate 22. In this latter case, the current collector is also serving as substrate material 22. A first layer of $LiMn_2O_4$, 23, is deposited having a thickness of 100-500 nanometers. After the first layer is completed a mask, 26, having geometric features of 100 nanometers or higher, is applied onto it and a layer of $Li_2MnO_3$, 29, is deposited. Finally the mask is removed and another layer of $LiMn_2O_4$, 34, having a thickness of 100-500 nanometers, is deposited to embed the $Li_2MnO_3$ features previously created.

Alternatively to using a mask, sputtering of $Li_2MnO_3$ can be employed to create irregular second phase regions on the first layer followed by a layer of $LiMn_2O_4$, having a thickness of 100-500 nanometers deposited to embed the second phases. As a third option is to create a uniform layer of $Li_2MnO_3$ onto the first layer of $LiMn_2O_4$ having a thickness of 50-100 nanometers and then a new layer of $LiMn_2O_4$, having a thickness of 100-500 nanometers to sandwich the $Li_2MnO_3$ layer. The function of the $Li_2MnO_3$ regions is to stabilize the spinel crystal structure of $LiMn_2O_4$ when, during discharge the number of Li+ ions is depleted and the structure becomes metastable. Normally the cathode material would transform to a more stable spinel-type configuration degrading the high potential and limiting capacity and rechargeability of the electrode, however the second phase prevents this from happening. Of course, there can be other variations, modifications, and alternatives.

Example 4

Breadloafing

Figure 5A:
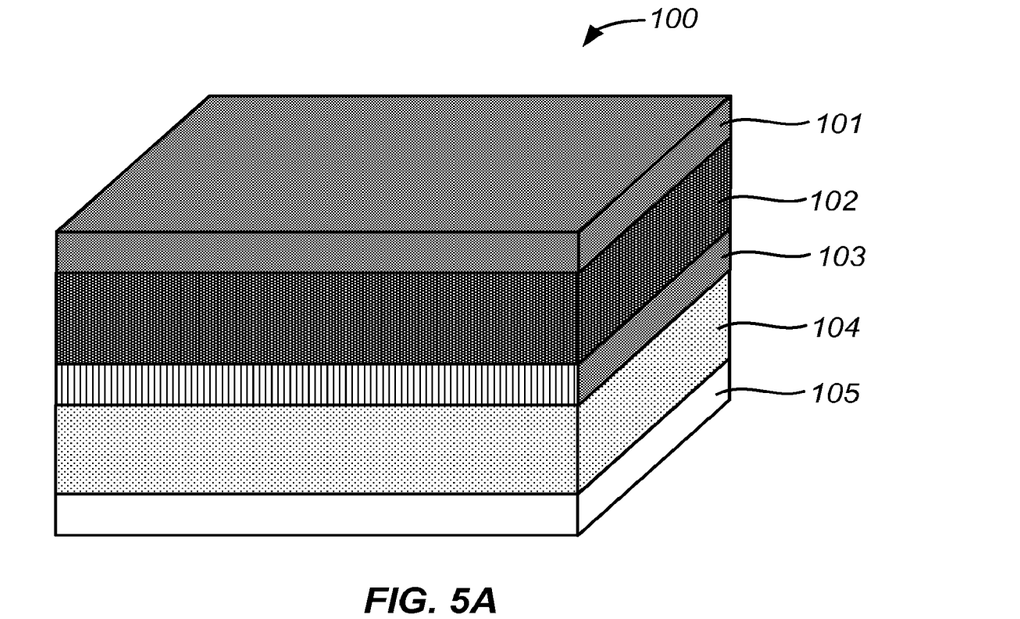
FIG. 5(A) illustrates a cathode with thin-film design according to an alternative embodiment of the present invention.
Figure 5B:
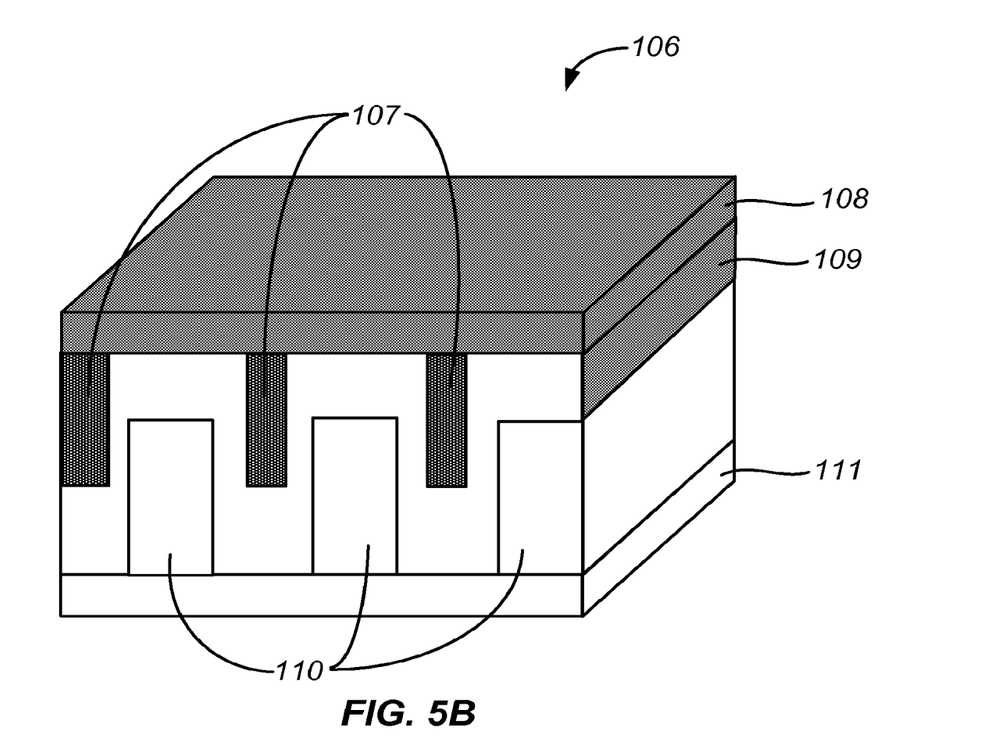
FIG. 5(B) illustrates a cathode with column design according to an alternative embodiment of the present invention.
Figure 5C:
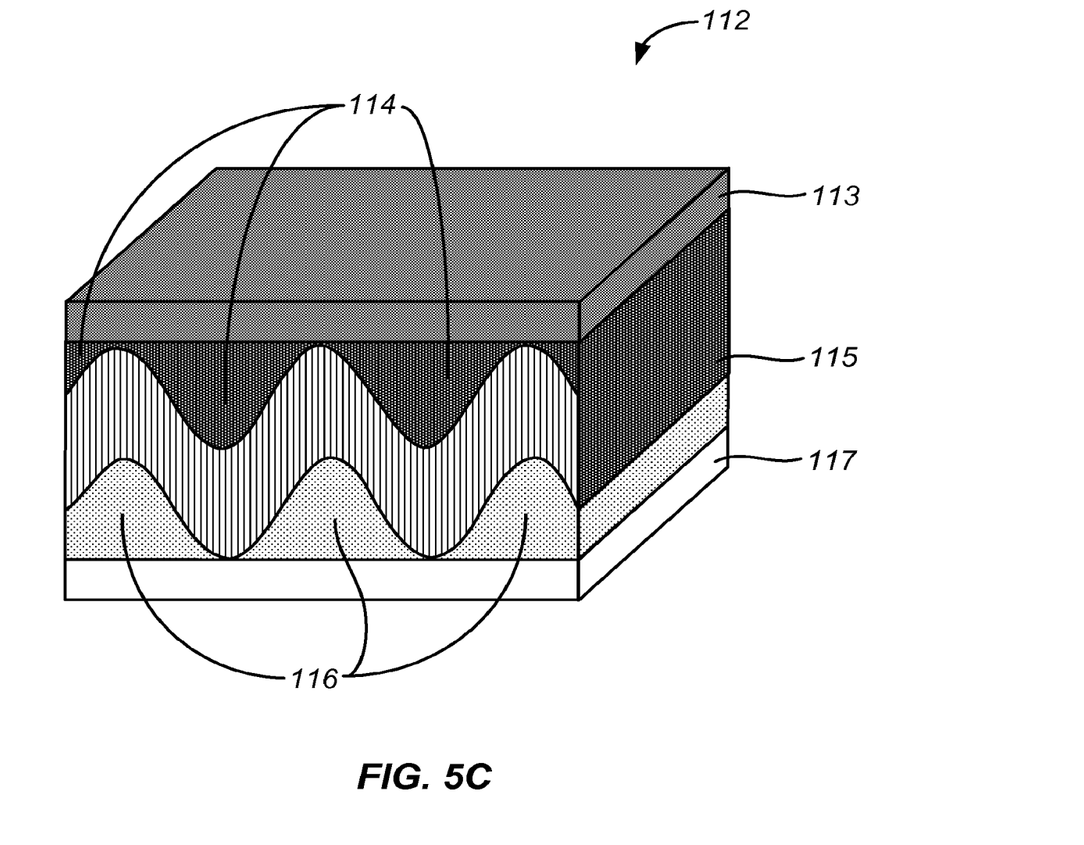
FIG. 5(C) illustrates a cathode with sinusoidal design according to an alternative embodiment of the present invention.
Figure 5D:
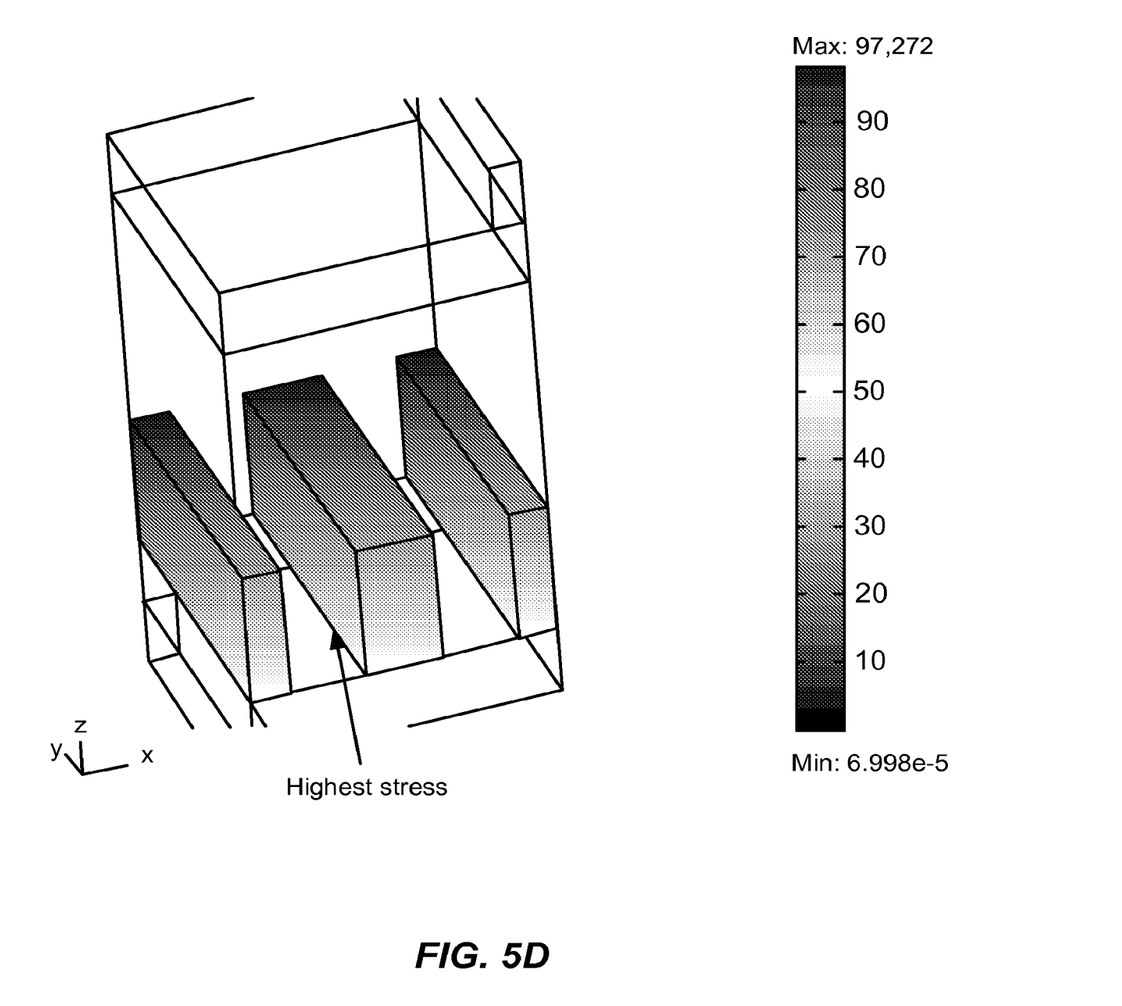
FIG. 5(D) illustrates contours of von-Mises stress on column design electrode.

Sinusoidal Form of Electrodes Interdigitated with Electrolyte, and Comb-Like Electrodes Interdigitated with Electrolyte This example demonstrates the process of identifying a new electrochemical cell with the optimal morphological shape of the electrode. As an example of the problems encountered by the designer, three different morphological designs of three-dimensional electrodes are provided: thin-film in Fig. SA, columnar shape in Fig. SB, and a sinusoidal shape in Fig. SC. The materials for the three-dimensional electrochemical cells are copper as anode current collector (101 in FIG. 5A, 108 in FIG. SB, 113 in FIG. 5C), lithium metal as anode (102 in FIG. SA, 109 in FIG. SB, 114 in FIG. 5C), polymer (polyethyleneoxide, PEO) with lithium salts (LiPF6) as the electrolyte (103 in FIG. SA, 110 in FIG. SB, 115 in FIG. 5C), lithium manganese oxide as cathode (104 in FIG. SA, 111 in FIG. SB, 116 in FIG. 5C), and aluminum as cathode current collector (105 in FIG. SA, 112 in FIG. SB, 117 in FIG. 5C). Because a polymer electrolyte is used, a separator is unnecessary. These three electrochemical cells (100, 106, and 112) are produced by physical vapor deposition (PVD) technique. Hence, the breadloafing is not avoidable. Cell performance of 100 would not be suitable for high-rate performance due to the low kinetic properties of LiMn2O4 103, such as the diffusivity of Li+ and electronic conductivity. Therefore, increasing the surface area of LiMn2O4 electrode would increase LiMn2O4 electrode exposure to the electrolyte; hence, increase the high-rate performance. The morphology of 106 and 112 are two possibilities. By utilizing the computational technique, described in commonly assigned, U.S. patent application Ser. No. 12/484,959, which is hereby incorporated by reference, as a numerical experiment, it shows that the maximum stress occurred at the edge, where the LiMn2O4, 110, connect with the current collector, 111 as indicated in FIG. 5D. Of course, there can be other variations, modifications, and alternatives.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for fabricating an electrode for an electrochemical cell, the method comprising: providing a substrate member having a predetermined periodic spatial pattern; depositing a thickness of material using one or more species overlying the predetermined periodic spatial pattern in a conformal manner, the thickness of material being characterized as a nanocomposite structure having an average feature size of about 500 nanometers and less; adjusting one or more parameters related to the deposition during a time period associated with the deposition of the thickness of material from a first spatial region of the thickness of material to a second spatial region of the thickness of material; and outputting an electrode element having a graded feature of one or more characteristics from the first spatial region to the second spatial region.

2. The method of claim 1, wherein the electrodes are formed using at least one technique from the group of evaporation, physical vapor deposition (PVD), chemical vapor deposition, low pressure chemical vapor deposition (LPCVD), atomic layer deposition (ALD), direct laser writing (DLW), sputtering, radio frequency magnetron sputtering, microwave plasma enhanced chemical vapor deposition (MPECVD), pulsed laser deposition (PLD), nanoimprint, ion implantation, laser ablation, spray deposition, spray pyrolysis, spray coating or plasma spraying.

3. The method of claim 1, further comprises adding a non liquid electrolyte for an electrochemical cell using the electrode element, the non-liquid electrolyte being made using a process selected from physical vapor deposition, laser deposition, centrifuge, spinning, microwave, thermal gradient, sintering, spray deposition, and chemical vapor deposition.

4. The method of claim 3, wherein an anode element, the electrolyte, and a cathode member are deposited sequentially or in reverse order.

5. The method of claim 1, wherein the one or more characteristics is selected from an intensive property including mass density, energy density, power density, composition, concentration, thermallelectroniclionic conductivities, thermallionic diffusivities, maximum strain, ultimate strength, moduli, ductility, and plasticity.

6. The method of claim 1, wherein the electrode element is characterized by an optimized morphology created for neutralizing internal stresses, stopping crack growth, maximizing material strength, and stabilizing active material structure in anode, electrolyte, cathode and current collectors.

7. The method of claim 1, further comprising a refresh process to reintroduce the graded feature of one or more characteristics from the first spatial region to the second spatial region if the graded feature is diminished from the first spatial region to the second spatial region.

8. The method of claim 1, wherein the predetermined periodic spatial pattern is an electrode design, the electrode design being provided by a mathematical process.

9. The method of claim 8, wherein the mathematical process uses a minimization or maximization of an intensive characteristic from within an allowed set of material characteristics.

10. The method of claim 9, wherein the mathematical process is selected from at least a surrogate-base analysis, genetic algorithm, adaptive topology optimization, design of experiments, ANOVA/MANOVA, basin based analysis, solid isotropic microstructure with intermediate mass penalization (SIMP), power penalized stiffness model, topology optimization of continuum structure, normal boundary intersection (NB I) optimization method, multivariable optimization method, or multidisciplinary design optimization.

11. The method of claim 1, wherein the depositing and adjusting is provided in a deposition chamber.

12. The method of claim 11, wherein the deposition chamber is provided to output a complete battery.

13. A method for fabricating an electrochemical cell, the method comprising: providing a substrate member having a predetermined periodic spatial pattern;
depositing a first thickness of material using one or more species overlying the predetermined periodic spatial pattern in a conformal manner, the first thickness of material being characterized as a nanocomposite structure having an average feature size of about 500 nanometers and less;
adjusting one or more parameters related to the deposition during a time period associated with the deposition of the first thickness of material from a first spatial region of the first thickness of material to a second spatial region of the first thickness of material to form a first electrode element having a graded feature of one or more characteristics from the first spatial region to the second spatial region; forming an electrolyte overlying the first electrode element; and forming a second electrode element overlying the electrolyte.

14. The method of claim 13, wherein the first electrode element, the second electrode element, and the electrolyte are provided within one or more deposition chambers.

15. The method of claim 13, wherein the first electrode element is a cathode and the second electrode element is an anode.

16. The method of claim 13, wherein the first electrode element is an anode and the second electrode element is a cathode.

17. The method of claim 13, further comprising depositing an anode current collector and a cathode current collector.

18. The method of claim 13, wherein the first electrode element, the electrolyte, and the second electrode element are deposited sequentially.

19. The method of claim 13, wherein the first electrode element, the electrolyte, and the second electrode element are deposited sequentially and continuously without breaking vacuum.

20. The method of claim 13, further comprising providing a separator between the first electrode element and the second electrode element.

21. The method of claim 20, wherein the separator is provided within the electrolyte.

22. A method for fabricating an electrode for an electrochemical cell, the method comprising: providing a substrate member having a predetermined periodic spatial pattern and comprising a current collector; depositing a thickness of material using one or more species overlying a surface region of the substrate member, the thickness of material being characterized as a nanocomposite material; adjusting one or more parameters during a time period associated with the depositing of the thickness of material from a first spatial region of the thickness of material to a second spatial region of the thickness of material; and causing formation of an electrode element having a graded feature of one or more characteristics from the first spatial region to the second spatial region.

\* \* \* \* \*